United States Patent
Chandan et al.

(10) Patent No.: US 10,490,675 B2
(45) Date of Patent: Nov. 26, 2019

(54) USER-PREFERENCE DRIVEN CONTROL OF ELECTRICAL AND THERMAL OUTPUT FROM A PHOTONIC ENERGY DEVICE

(71) Applicant: International Business Machines Corporation, Armonk, NY (US)

(72) Inventors: Vikas Chandan, Bengaluru (IN); Shivkumar Kalyanaraman, Bengaluru (IN); Pratyush Kumar, Bengaluru (IN); Sukanya Randhawa, Hyderabad (IN)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 15/057,369

(22) Filed: Mar. 1, 2016

(65) Prior Publication Data
US 2017/0257061 A1     Sep. 7, 2017

(51) Int. Cl.
*H01L 31/044* (2014.01)
*H01L 31/02* (2006.01)
(Continued)

(52) U.S. Cl.
CPC ........ *H01L 31/02021* (2013.01); *F24S 10/50* (2018.05); *F24S 23/77* (2018.05);
(Continued)

(58) Field of Classification Search
CPC ....... H01L 31/00–078; Y02E 10/50–60; H02S 10/00–40; H02S 20/00–32;
(Continued)

(56) References Cited

U.S. PATENT DOCUMENTS

| | | |
|---|---|---|
| 5,108,218 A | 4/1992 | Wyckoff |
| 6,017,002 A | 1/2000 | Burke et al. |

(Continued)

FOREIGN PATENT DOCUMENTS

| | | |
|---|---|---|
| DE | 102008009477 A1 | 8/2008 |
| IN | 2956CHE2012 A | 4/2016 |

(Continued)

OTHER PUBLICATIONS

Zhu et al., Stress-dependent molecular pathways of silica-water reaction, Journal of the Mechanics and Physics of solids, 53 (2005) 1597-1623.
(Continued)

*Primary Examiner* — Bach T Dinh
(74) *Attorney, Agent, or Firm* — Ryan, Mason & Lewis, LLP

(57) ABSTRACT

Methods, systems, and computer program products for user-preference driven control of electrical and thermal output from a photonic energy device are provided herein. A computer-implemented method includes automatically modulating an amount of thermal output and/or electrical power output generated by a solar photovoltaic module in response to an input of one or more user preferences by: adjusting at least one variable pertaining to a fluid positioned on the solar photovoltaic module based on the one or more user preferences; and adjusting at least one variable pertaining to one or more reflective surfaces physically connected to the solar photovoltaic module based on the one or more user preferences.

12 Claims, 21 Drawing Sheets

(51) Int. Cl.
| | |
|---|---|
| *H01L 31/048* | (2014.01) |
| *H02S 40/22* | (2014.01) |
| *H02S 40/44* | (2014.01) |
| *F24S 50/20* | (2018.01) |
| *F24S 50/40* | (2018.01) |
| *F24S 10/50* | (2018.01) |
| *F24S 23/77* | (2018.01) |
| *F24S 30/42* | (2018.01) |

(52) U.S. Cl.
CPC ............... *F24S 50/20* (2018.05); *F24S 50/40* (2018.05); *H01L 31/048* (2013.01); *H02S 40/22* (2014.12); *H02S 40/44* (2014.12); *F24S 30/42* (2018.05); *Y02E 10/44* (2013.01); *Y02E 10/47* (2013.01); *Y02E 10/52* (2013.01); *Y02E 10/60* (2013.01)

(58) Field of Classification Search
CPC ......... H02S 30/00–20; H02S 40/00–40; H02S 50/00–15
USPC .................................................. 136/243–265
See application file for complete search history.

(56) References Cited

U.S. PATENT DOCUMENTS

| | | | |
|---|---|---|---|
| 8,655,497 B2 | 2/2014 | Campanile et al. | |
| 2004/0025931 A1* | 2/2004 | Aguglia | F24J 2/0472 136/246 |
| 2009/0151769 A1 | 6/2009 | Corbin | |
| 2009/0283135 A1 | 11/2009 | Neeb | |
| 2010/0057267 A1* | 3/2010 | Liu | H02J 3/18 700/297 |
| 2010/0170561 A1* | 7/2010 | Peng | H01L 31/0521 136/246 |
| 2011/0197943 A1* | 8/2011 | Pleva | F24J 2/045 136/244 |
| 2012/0160234 A1 | 6/2012 | Wares | |
| 2012/0325288 A1 | 12/2012 | Jang et al. | |
| 2013/0328090 A1 | 12/2013 | Park | |
| 2014/0094980 A1* | 4/2014 | Saito | G05B 13/026 700/291 |
| 2014/0238465 A1 | 8/2014 | Kos et al. | |
| 2014/0373900 A1 | 12/2014 | Lamkin et al. | |
| 2015/0155414 A1* | 6/2015 | Bedell | H01L 31/0543 320/101 |
| 2016/0056320 A1* | 2/2016 | Chang | H01L 31/0543 136/259 |
| 2016/0087132 A1 | 3/2016 | Alteneiji | |

FOREIGN PATENT DOCUMENTS

| | | | |
|---|---|---|---|
| WO | 2010003115 A1 | 1/2010 | |
| WO | 2015122891 A1 | 8/2015 | |

OTHER PUBLICATIONS

Wikipedia, Concentrator Photovoltaics, Oct. 5, 2016, pp. 1-11. http://en.wikipedia.org/wiki/Concentrated_photovoltaics#Concentrated_photovoltaics_and_thermal.

Wikipedia, Diffuse Reflection, Oct. 5, 2016, pp. 1-4, http://en.wikipedia.org/wiki/Diffuse_reflection.

Wikipedia, Optical Coating, Oct. 5, 2016, pp. 1-5, http://en.wikipedia.org/wiki/Optical_coating.

Wikipedia, Perfect Mirror, Oct. 5, 2016, pp. 1-2, http://en.wikipedia.org/wiki/Perfect_mirror.

Woodford, Heat-Reflecting Low-E Glass, Jul. 10, 2016, pp. 1-10, http://www.explainthatstuff.com/how-low-e-heat-reflective-windows-work.html.

KentOptronics, Liquid Crystal for Photonics, Switchable Mirror, Switchable Glass, pp. 1-2, Oct. 5, 2016, http://www.kentoptronics.com/mirror.html.

Wikipedia, Light Tube, Oct. 5, 2015, pp. 1-8, http://en.wikipedia.org/wiki/Light_tube.

Orientation & Zoning of Buildings to Reduce Solar Gain: Rio de Janeiro, Oct. 5, 2016, pp. 1-5, http://www.riorenewables.com/efficient-design/orientation-zoning.

PlanetEnergy.co.uk, Sales Inquiry, 2015, pp. 1, http://www.planetenergy.co.uk/Solar%20Vacuum%20v%20Flat%20Collector%20Comparison.pdf.

Solar Radiation Control Coatings Tested at ORNL User Center, Sep. 9, 1996, pp. 1-3, http://web.ornl.gov/sci/roofs+walls/facts/SolarRadiationControl.htm.

Wikipedia, Concentrator Photovoltaics, Oct. 5, 2016, pp. 1-11, http://en.wikipedia.org/wiki/Concentrated_photovoltaics.

How to Boost any Solar Panel Output by 75%, 2014, pp. 1-20, http://geo-dome.co.uk/article.asp?uname=solar_mirror.

List of IBM Patents or Applications Treated as Related.

Karami et al., "Heat transfer enhancement in a hybrid microchannel-photovoltaic cell using Boehmite nanofluid." International Communications in Heat and Mass Transfer 55 (2014): 45-52.

Armstrong et al., "A thermal model for photovoltaic panels under varying atmospheric conditions." Applied Thermal Engineering 30, No. 11 (2010): 1488-1495.

Hollick et al., "PV Thermal Systems; Capturing the Untapped Energy." In Proceedings of the Solar Conference, vol. 1, p. 285. American Solar Energy Society; American Institute of Architects, 2007.

Hosseini et al., "An experimental study of combining a photovoltaic system with a heating system." In World renewable energy congress, vol. 8, pp. 2993-3000. 2011.

Lin et al., "Non-tracked mirror-augmented photovoltaic design and performance." In Photovoltaic Specialists Conference (PVSC), 2012 38th IEEE, pp. 002076-002081. IEEE, 2012.

Moharram et al., "Enhancing the performance of photovoltaic panels by water cooling." Ain Shams Engineering Journal 4, No. 4 (2013): 869-877.

Wikipedia, Reflectance, https://en.wikipedia.org/wiki/Reflectance, 2015.

Nalamwar, A., NESPAL Air Water Heater, Mar. 1, 2015.

\* cited by examiner

USER-PREFERENCE DRIVEN CONTROL OF ELECTRICAL AND THERMAL OUTPUT FROM A PHOTONIC ENERGY DEVICE

FIELD

The present application generally relates to information technology, and, more particularly, to photonic energy device management.

BACKGROUND

Solar energy system output and efficiency face numerous challenges, such as, for example, efficient heat extraction and leveraging changing demand levels. Existing solar energy systems, however, do not incorporate user preferences with respect to demand, nor do existing approaches encompass a capability of proactively leveraging forecast information to increase output efficiency.

SUMMARY

In one embodiment of the present invention, techniques for user-preference driven control of electrical and thermal output from a photonic energy device are provided. An exemplary computer-implemented method can include automatically modulating an amount of thermal output and/or electrical power output generated by a solar photovoltaic module in response to an input of one or more user preferences by (i) adjusting at least one variable pertaining to a fluid positioned on the solar photovoltaic module based on the one or more user preferences, and (ii) adjusting at least one variable pertaining to one or more reflective surfaces physically connected to the solar photovoltaic module based on the one or more user preferences.

In another embodiment of the invention, a system can include a solar photovoltaic module, and a fluid positioned on the solar photovoltaic module, wherein at least one variable pertaining to the fluid is configurable based on one or more user preferences. The system also includes a plurality of configurable reflective surfaces that (i) collect direct solar radiation and diffuse solar radiation and (ii) distribute the collected direct solar radiation and the collected diffuse solar radiation across (a) multiple portions of the fluid and/or (b) one or more portions of the solar photovoltaic module. Additionally, each one of the plurality of configurable reflective surfaces is physically connected to the solar photovoltaic module at an angle that is variable in relation to the surface of the solar photovoltaic module, and at least one variable pertaining to each one of the plurality of configurable reflective surfaces is configurable based on the one or more user preferences. Further, the system also includes a controller, wherein said controller comprises at least a memory and a processor coupled to the memory. The controller modulates an amount of thermal output and/or electrical power output generated by the solar photovoltaic module in response to an input of the one or more user preferences by transmitting a signal to adjust the at least one variable pertaining to a fluid in response to the one or more user preferences, and transmitting a signal to adjust the at least one variable pertaining to one or more of the plurality of reflective surfaces in response to the one or more user preferences.

An alternative embodiment of the above-noted system can include at least one glass surface positioned over the solar photovoltaic module, and a fluid positioned between (i) the glass surface and (ii) the solar photovoltaic module, wherein at least one variable pertaining to the fluid is configurable based on one or more user preferences.

Another embodiment of the invention or elements thereof can be implemented in the form of an article of manufacture tangibly embodying computer readable instructions which, when implemented, cause a computer to carry out a plurality of method steps, as described herein. Furthermore, another embodiment of the invention or elements thereof can be implemented in the form of an apparatus including a memory and at least one processor that is coupled to the memory and configured to perform noted method steps. Yet further, another embodiment of the invention or elements thereof can be implemented in the form of means for carrying out the method steps described herein, or elements thereof; the means can include hardware module(s) or a combination of hardware and software modules, wherein the software modules are stored in a tangible computer-readable storage medium (or multiple such media).

These and other objects, features and advantages of the present invention will become apparent from the following detailed description of illustrative embodiments thereof, which is to be read in connection with the accompanying drawings.

DETAILED DESCRIPTION

As described herein, an embodiment of the present invention includes user-preference driven control of electrical and thermal output from a photonic energy device. At least one embodiment of the invention includes automatically tuning between electrical and thermal power generated from a photonic energy harvester (also referred to herein as a solar photovoltaic (PV) module) based on user preferences by controlling augmented optical mirrors and the amount of heat extracted from the system by passing fluid on top of the panel.

One or more embodiments of the invention include establishing a closed-loop control system based on user preference(s) and/or user interaction with the system by automatically modulating the percentage of thermal and electrical power output based on dynamic adjustment of water level and/or velocity of water in/on the photonic harvester panel. Additionally, at least one embodiment of the invention can include automatically adjusting the inclination and/or reflectivity point of one or more optical mirrors connected to the photonic harvester panel for controlling the aggregate/average thermal and electrical output from the photonic harvester. One or more controllers can be implemented to regulate the thermal and electrical outputs via controlling variables such as noted above.

As also detailed herein, one or more embodiments of the invention can additionally include automatically recommending an adjustment of set-points (such as water level, inclination and/or reflectivity point of optical mirrors, for example) to a user based on a weather-related forecast (such as an irradiance forecast, for example). Further, at least one embodiment of the invention can include incorporating structured glass in addition to one or more water cells for improved solar and thermal trapping.

As described herein, an example embodiment of the invention that includes positioning fluid (such as water, for example) on top of a PV panel results in multiple benefits such as cleaning the surface of the panel of dust (which reduces maintenance cost), absorbing infrared light before it is incident on the panel (which increases total system efficiency by reducing the heating effects in solar cells), and cooling the panel from the top by capturing the radiated heat from the panel (wherein such heat can be promptly transferred to the fluid on top, which takes the heat away as the fluid is flowing).

Figure 1:
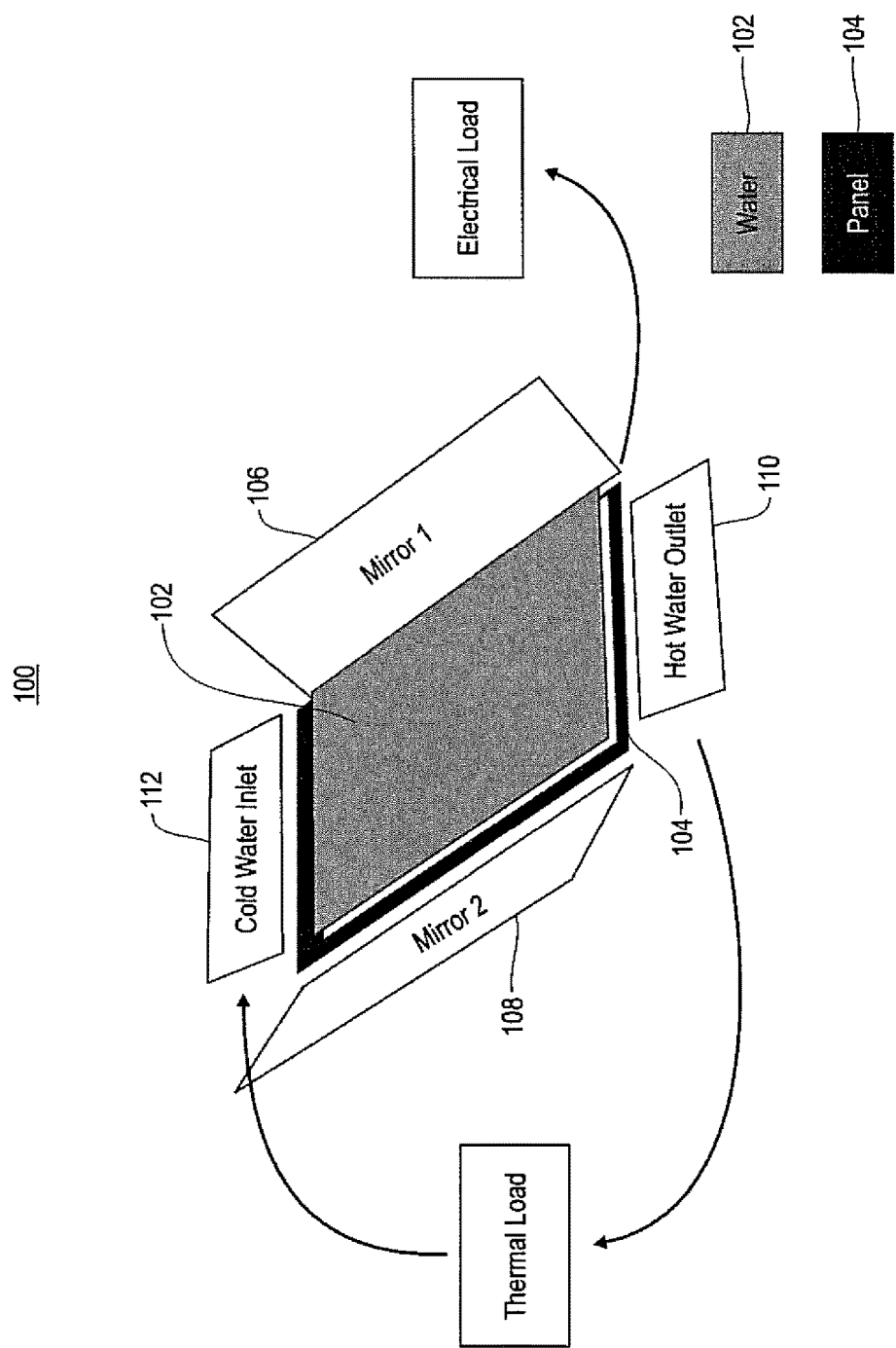
FIG. 1 is a diagram illustrating system architecture, according to an exemplary embodiment of the invention.

FIG. 1 is a diagram illustrating system 100 architecture, according to an exemplary embodiment of the invention. By way of illustration, FIG. 1 depicts water 102 positioned on top of a PV panel 104, which also includes a cold water inlet 112 and a hot water outlet 110. As illustrated, a thermal load is output and transferred from the hot water outlet 110 to the cold water inlet 112, and an electrical load is output by the PV panel 104. Additionally, FIG. 1 also depicts mirrors 106 and 108, which are physically connected to the PV panel 104.

It should also be noted that one or more of the enumerated elements of FIG. 1 are additionally illustrated in subsequent figures.

Figure 2:
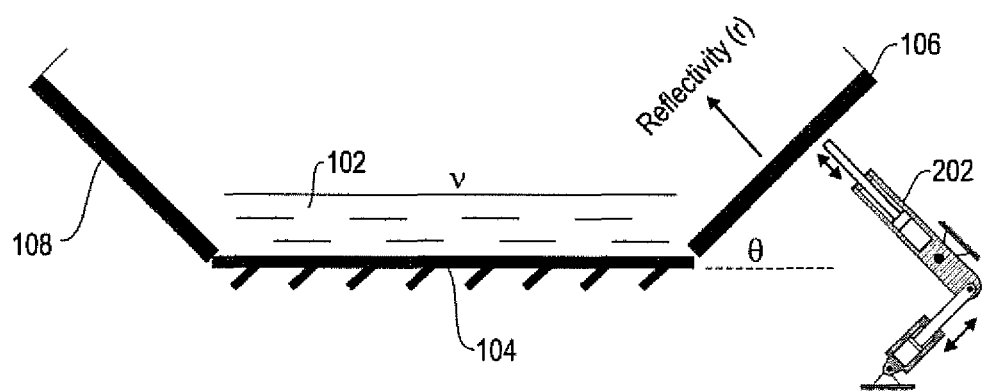
FIG. 2 is a diagram illustrating system architecture, according to an exemplary embodiment of the invention.

FIG. 2 is a diagram illustrating system architecture, according to an exemplary embodiment of the invention. By way of illustration, FIG. 2 depicts fluid (such as water) 102 positioned on top of PV panel 104, mirrors 106 and 108 connected to the panel 104, and a hydraulic mechanism and/or actuator 202 implemented in connection with mirror 106. As described herein, a system such as depicted in FIG. 2 can modulate the relative percentage of thermal and electrical output by changing the height (h) (or depth) of the fluid 102 flowing over the panel 104 and/or changing the velocity (v) of the fluid 102 flowing over the panel 104. Modulating the aggregate of thermal and electrical output can additionally be carried out by changing the inclination (θ) of mirrors 106 and/or 108 on the photonic harvester and/or changing the reflectivity (r) of mirrors 106 and/or 108 on the photonic harvester.

Such embodiments of the invention include establishing a closed-loop control of the system with user interaction, which can include a user-interface for scheduling of demanded thermal and electrical outputs, and for specifying rules to apply during a mismatch of demand and output. An analytics back-end engine (such as depicted via component 1112 in FIG. 11) can be implemented to regulate operation of the system by a hierarchical control architecture regulating height and velocity of fluid flow as well as the inclination and reflectivity of mirrors to match output requirements set by the user. At least one embodiment of the invention can also include implementing a rule-based decision engine to modify the control parameters when expected output does not match specified demand.

Figure 3A:
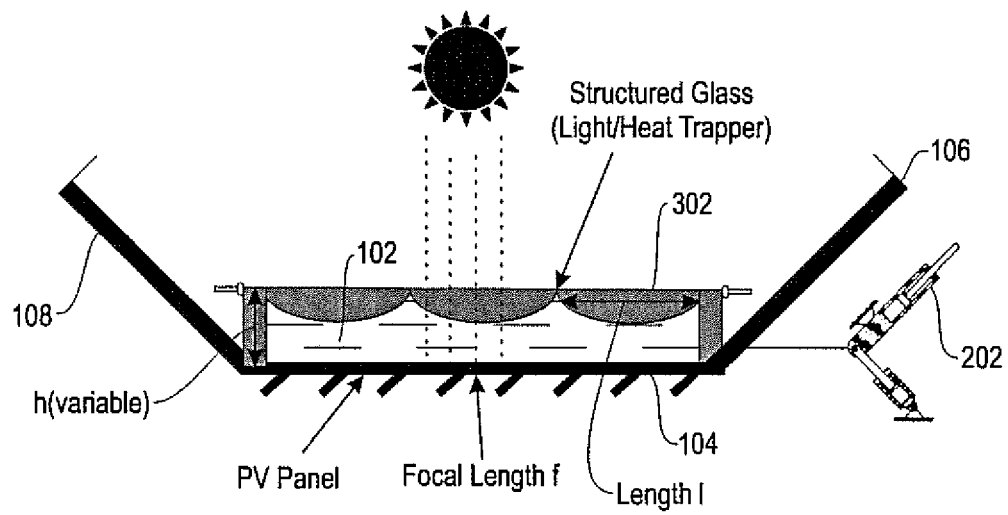
FIG. 3A-FIG. 3C are diagrams illustrating system architecture, according to exemplary embodiments of the invention.
Figure 3B:
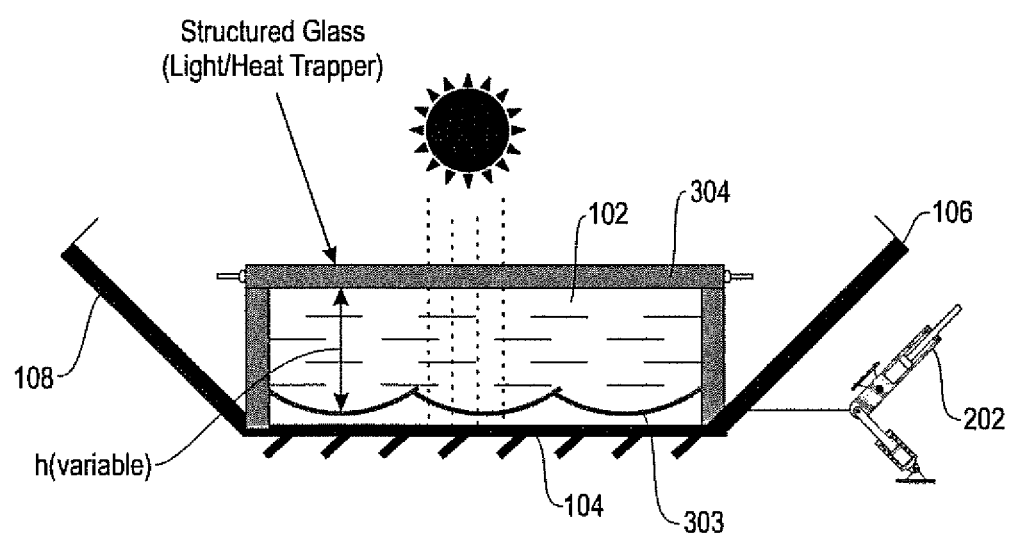
Figure 3C:
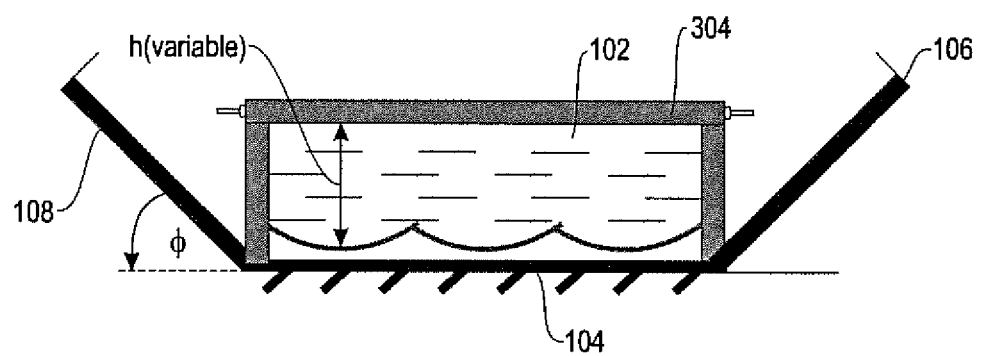

FIG. 3A-FIG. 3C are diagrams illustrating system architecture, according to exemplary embodiments of the invention. By way of illustration, FIG. 3A-FIG. 3C depict an embodiment of the invention that includes structured glass on top of the PV panel 104. In one or more embodiments of the invention, tempered glass can be used. In FIG. 3A, the fluid 102 flows sandwiched between the glass 302 and the PV panel 104. In FIG. 3B, the fluid 102 flows inside a water cell with a structured bottom glass surface 303 that acts like a water lens. In both FIG. 3A and FIG. 3B, the top glass surface (302 in FIG. 3A, and 304 in FIG. 3B) is adjustable, thereby allowing control of the height (h) of the water level and hence the volume of water inside the (glass) enclosure. This simultaneously allows for control over the focal point (f) of the glass/water lens, which can be adjusted to focus inside the water or at the surface panel. The length (l) of each lens element can be chosen according to the desired area of the focus spot. The length can be chosen to be large enough such that the focused spot covers a part of an entire panel unit (for example, on lens per panel), or the length can be relatively small such that an array of the lenses uniformly illuminate a given panel. Additionally, water can be circulated inside of the enclosure by means of one or more inlet/outlet valves.

As implemented in one or more embodiments of the invention, structured glass (such as, for example, an array of convex lenses) can increase solar light trapping and focusing at the PV panel. Also, due to the retention of the infrared (IR) spectral components of the solar light by glass, the heat generated inside the glass enclosure can be significantly higher (than that generated without a glass enclosure) due to the greenhouse effect. This can be utilized, for example, for heating (cold) water circulated inside the system. Circulation of cold water over a PV panel can radiatively keep the panel surface temperature cooler and prevent the panel from overheating and/or prevent loss in electrical output efficiency of the PV panel. Also, due to a uniform spread of photons, localized shadows can be averaged out in one or more embodiments of the invention. Additionally, enhanced light trapping and non-direct contact of the PV panel surface with air can reduce the sensitivity of the system to soiling and dust issues. Further, at high temperatures within the enclosure (for example, at peak sun hours), evaporation of water can be used to create a diffuser at the top glass surface.

Alternatively, one or more embodiments of the invention can include incorporating a diffuser, wherein the fluid flows between the diffuser and the panel. In such an embodiment, the diffuser acts as a trap for incoming photons, generating higher heat and electrical output. The diffuser also retains generated heat more effectively because of a greenhouse-like effect, and the diffuser uniformly spreads the incoming photons, thereby averaging out localized shadows.

Also, in connection with the embodiment depicted in FIG. 3C, reflectance $(R)=\{(n-n')/(n+n')\}^2$. As noted herein, the refractive index of medium 1 is denoted as n, and the refractive index of medium 2 is denoted as n'. It is to be noted that absorption and scattering of visible electromagnetic spectrum in water is negligible. Also, the net optical gain $G(\Phi,h)$=(the optical gain at the panel)−(the optical loss through the system), wherein the optical loss is approximated as the total reflection losses at the glass 304 interface(s) in addition to absorption and scattering.

Also, one or more embodiments of the invention can include implementing water on both sides of the system. In such an embodiment, water can be circulated at the rear end of the panel to maintain panels at a cooler temperature. Integration of water flow around the panel can reduce losses associated with heating (keeping the panel temperature constant and/or optimal), reduce overall panel resistances, and prove useful for providing sufficient heat to flowing water.

Figure 4:
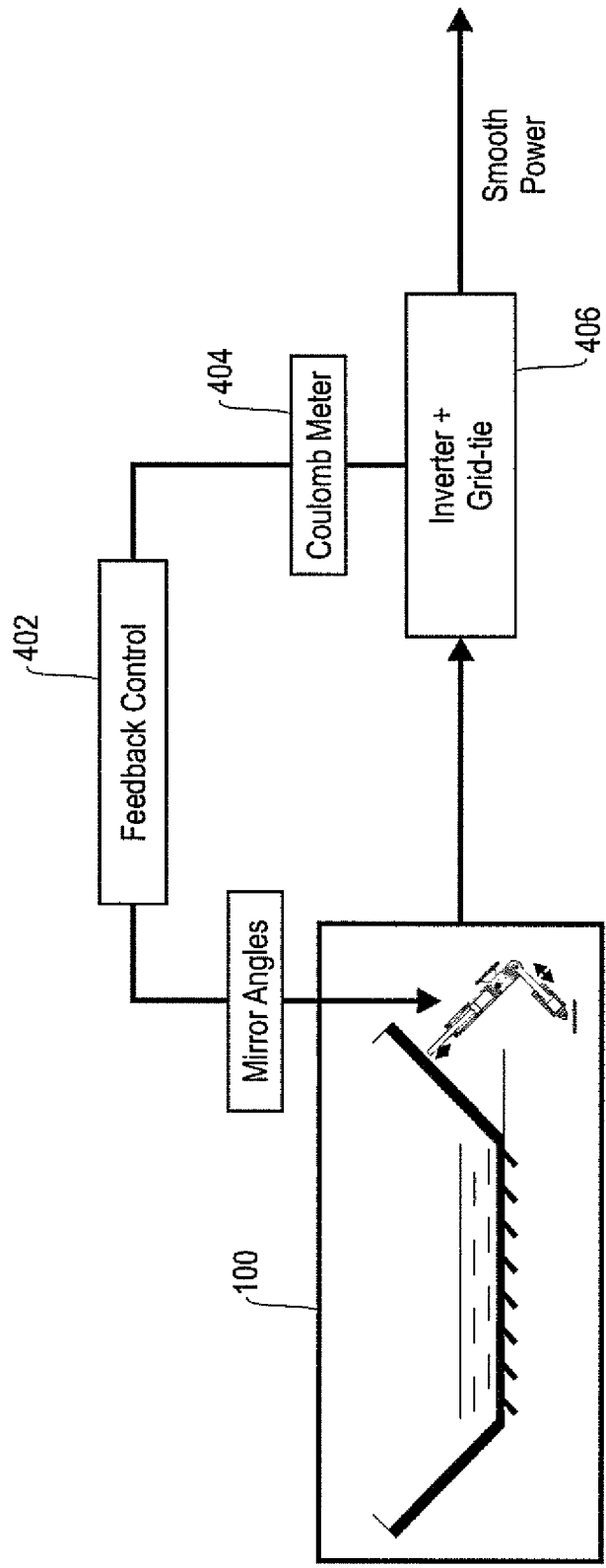
FIG. 4 is a diagram illustrating system architecture, according to an exemplary embodiment of the invention.

FIG. 4 is a diagram illustrating system architecture, according to an exemplary embodiment of the invention. By way of illustration, FIG. 4 depicts photonic harvester system 100, a feedback control component 402, a coulomb meter 404, and an inverter and grid-tie component 406. The coulomb meter 404 continuously measures the amount of energy generated by the panel. This measurement is used by the feedback controller 402 to adjust the reflectors of the photonic harvester system 100. An objective of this adjustment can include ensuring that the incident irradiance on the panel and the resultant energy generated has a small variance. Consequently, this feedback setup smoothens the power in-fed by the photonic harvester 100 into the grid via the inverter and grid-tie component 406.

Additionally, at least one embodiment of the invention includes enacting smoothing via the photonic harvester. For example, at times of cloud cover, the mirrors can be angled to increase incident irradiance. At other times, the mirrors can be angled to smooth the output power.

One or more embodiments of the invention can additionally include sharing mirrors across multiple harvesters. Photonic harvesters can be built at different granularity levels ranging from a single panel to entire farms, and larger reflectors can be made out of particular materials suitably strengthened to withstand wind.

Figure 5:
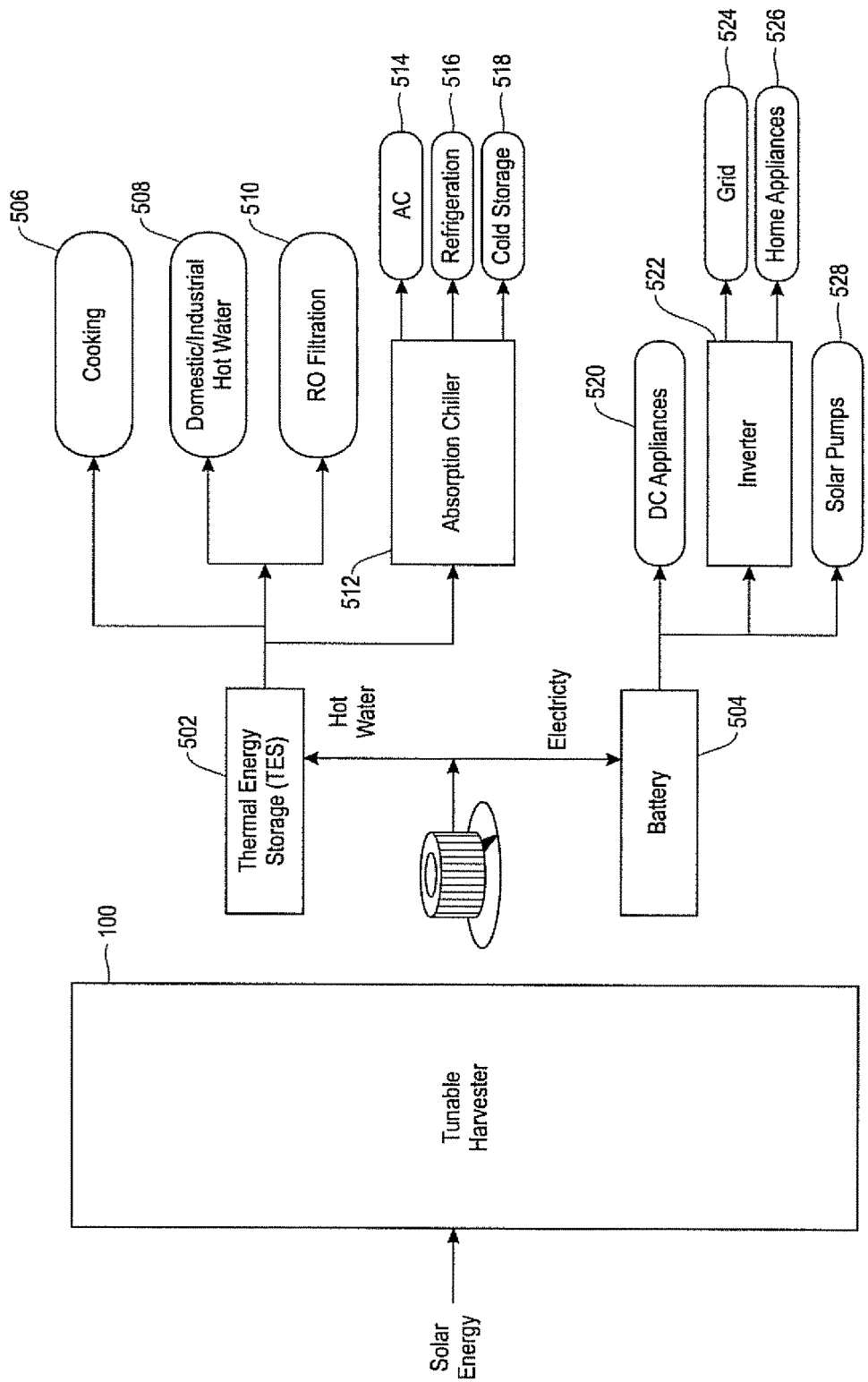
FIG. 5 is a diagram illustrating an implementation of an exemplary embodiment of the invention.

FIG. 5 is a diagram illustrating an implementation of an exemplary embodiment of the invention. By way of illustration, FIG. 5 depicts a tunable harvester 100, which captures solar energy and outputs energy to a number of storage components such as a battery 504 and a thermal energy storage (TES) component 502. The energy stored in these storage components can subsequently be used by a variety of devices and/or applications. For example, energy from the TES component 502 can be used by a cooking component 506, a domestic and/or industrial hot water component 508, a reverse osmosis (RO) filtration component 510, and an absorption chiller 512. The absorption chiller 512 can further be utilized for an air conditioning (AC) component 514, a refrigeration component 516, and a cold storage component 518. Additionally, the energy from the battery 504 can be used by direct current (DC) appliances 520, an inverter 522, and solar pumps 528. The inverter 522 can further be utilized for a grid 524 as well as for home appliances 526.

Example usage in a tightly coupled plant can include a specific thermal output such as, for example, pre-heating water prior to steam conversion. Additionally, example usage in a building absorption chiller can include a specific thermal output such as, for example, pre-heating water prior to a boiler stage, thereby reducing the boiler load and/or fuel consumption, as well as decreasing the operating expenses and corresponding carbon footprint.

Additionally, by way of further example, certain sections of water/irrigation canals (in villages or remote areas, for example) can employ an embodiment of the invention, such as depicted in FIG. 3A, wherein a PV panel is installed at a depth (such as, for instance, ~0.5 meters) within the canal, and a micro-structured glass lining can be positioned on top of the water. Advantages of such an implementation can include, for example, improved heat and/or electricity generation. Also, heated water generated due to the greenhouse effect could be used, for example, to clean pollution from the water and improve the quality of the water, while also preventing losses due to evaporation.

Figure 6A:
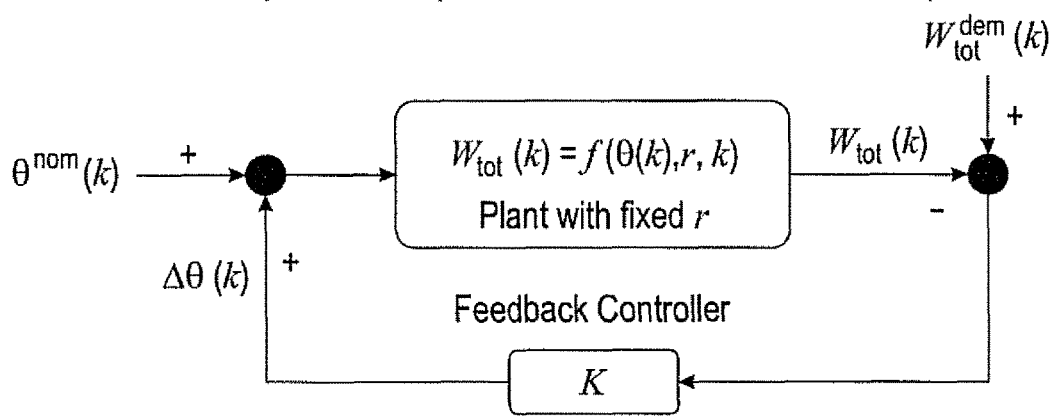
FIG. 6A-FIG. 6C are diagrams illustrating outer loop and/or supervisory control for matching total demand, according to exemplary embodiments of the invention.
Figure 6B:
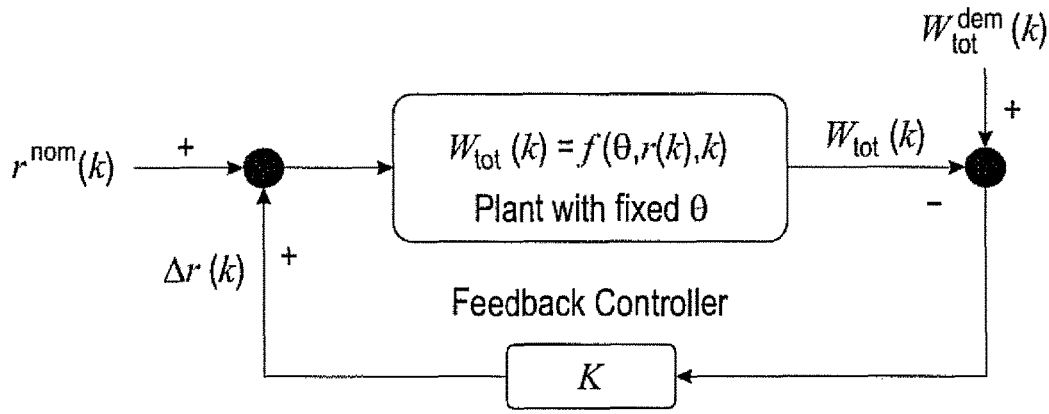
Figure 6C:
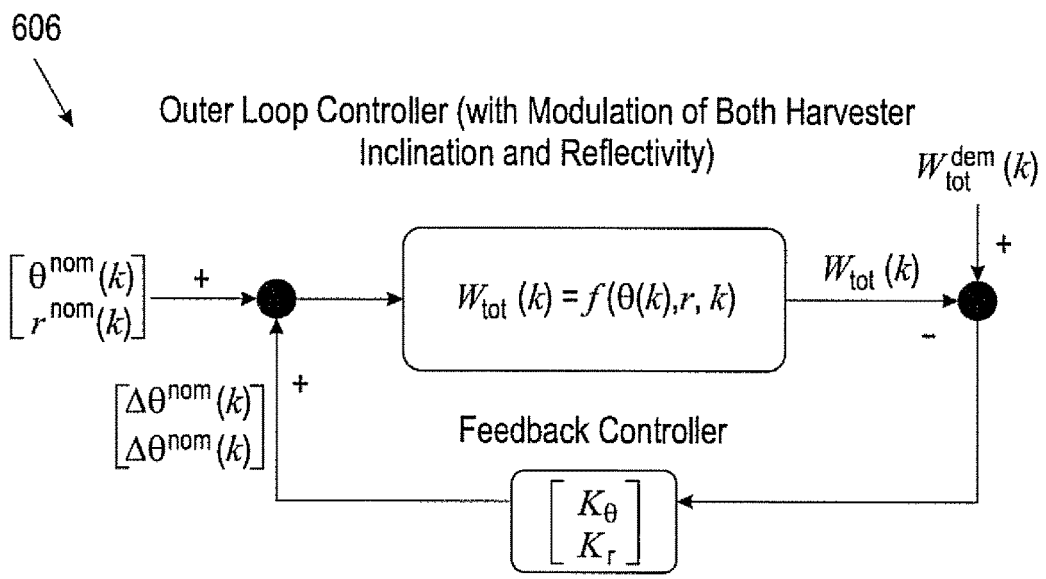

FIGS. 6A-6C are diagrams illustrating outer loop and/or supervisory control for matching total demand, according to exemplary embodiments of the invention. In connection with FIGS. 6A-6C, the total demand computation at time instant k is computed as follows: $W_{tot}^{dem}(k)=W_{elec}^{dem}(k) W_{thermal}^{dem}(k)$. Additionally, the PV "total throughput" model is computed as follows: $W_{tot}(k)=f(\theta(k), r(k), k)$. Accordingly, FIG. 6A illustrates an outer loop controller 602 with modulation of mirror inclination, FIG. 6B illustrates an outer loop controller 604 with modulation of mirror reflectivity, and FIG. 6C illustrates an outer loop controller 606 with modulation of both harvester inclination and reflectivity. In each of FIGS. 6A-6C, a feedback controller is used to achieve a set-point/target value of the total electrical power output by adjusting the mirror inclination, mirror reflectivity, or both.

Accordingly, one or more embodiments of the invention include implementing an outer loop/supervisory control component for matching total demand, as well as an inner loop component for tuning electrical versus thermal demand. Additionally, such an embodiment can also include implementing a recommendation engine that determines and outputs one or more options to a user if matching is not possible. Further, in such an embodiment, tunability can be determined as follows:

$$\rho = \frac{E_{thermal}}{E_{electrical}} = \frac{A_w(h)}{A_p(h)\eta_p(h)} := f(h),$$

wherein $E_{thermal}$ refers to thermal output, $E_{electrical}$ refers to electrical output, $A_w$ refers to absorptivity of water, $A_p$ refers to absorptivity of a panel, and $\eta_p$ refers to panel electrical efficiency. Note also that $A_w$, $A_p$, and $\eta_p$ are dependent on h (height of the water). As h increases, $A_w$ shall increase, $A_p$ shall decrease, and $\eta_p$ shall increase (higher efficiency due to more cooling). Based on the user setting, $\rho$, the control architecture adjusts h to achieve the set $\rho$.

Figure 7A:
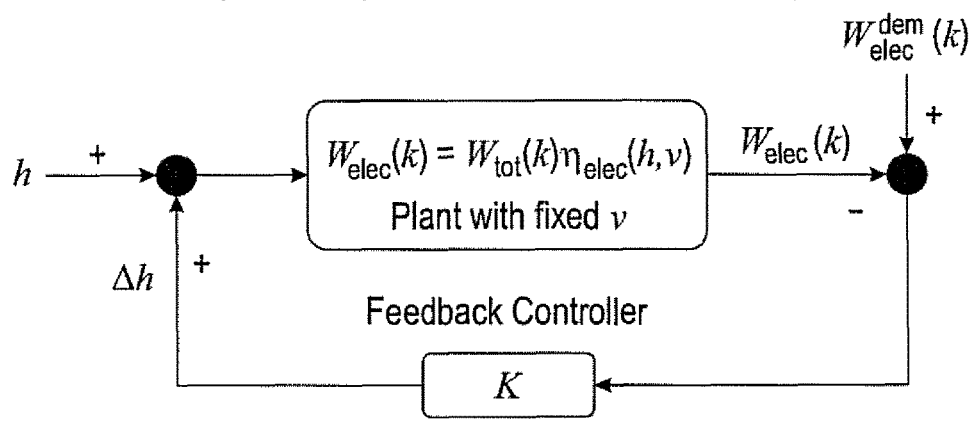
FIG. 7A-FIG. 7F are diagrams illustrating inner loop and/or supervisory control for matching individual demand, according to exemplary embodiments of the invention.
Figure 7B:
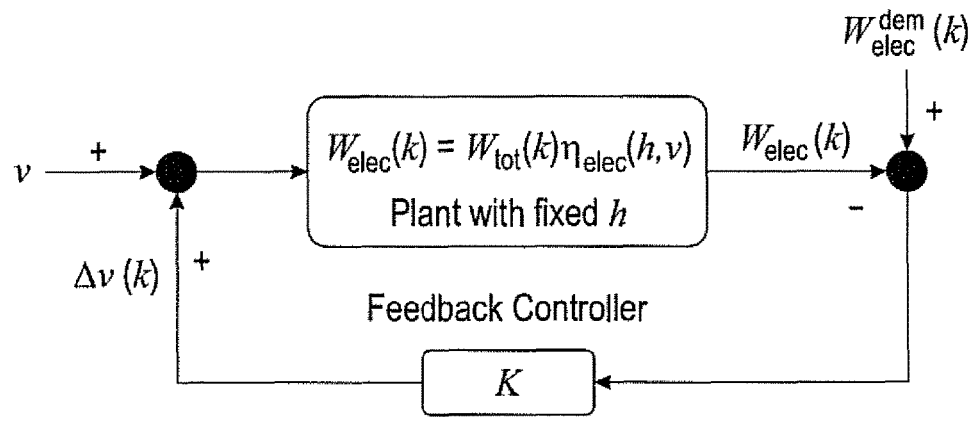
Figure 7C:
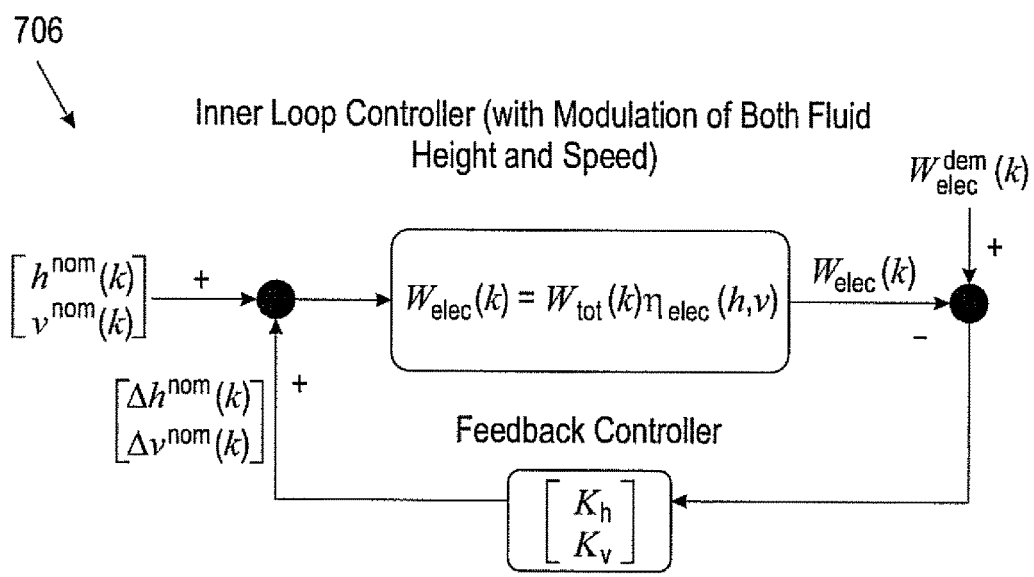

FIGS. 7A-7F are diagrams illustrating inner loop and/or supervisory control for matching individual demand, according to exemplary embodiments of the invention. In connection with FIGS. 7A-7F, the total demand computation at time instant k is computed as follows: $W_{elec}(k)=W_{tot}(k) \eta_{elec}(h,v)$. Additionally, the total demand computation at time instant k is computed as follows: $W_{thermal}(k)=W_{tot}(k) \eta_{thermal}(h, v)$. Accordingly, FIG. 7A illustrates an inner loop control 702 with modulation of fluid height, FIG. 7B illustrates an inner loop control 704 with modulation of fluid speed/velocity, and FIG. 7C illustrates an inner loop controller 706 with modulation of both fluid height and speed.

Figure 7D:
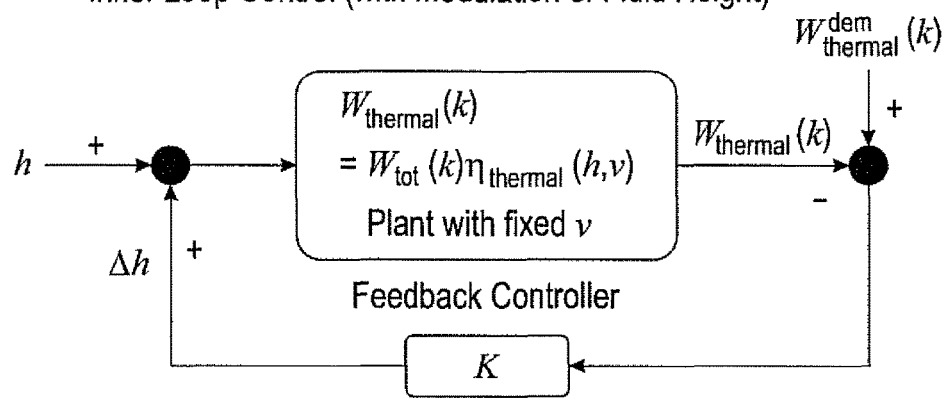
Figure 7E:
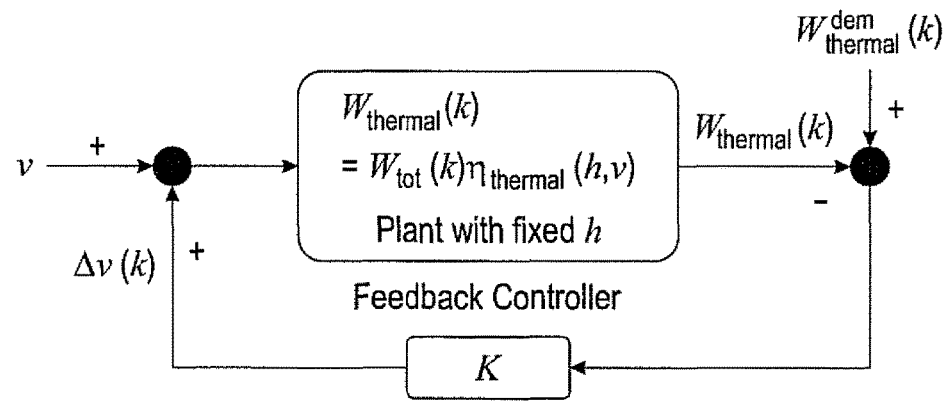
Figure 7F:
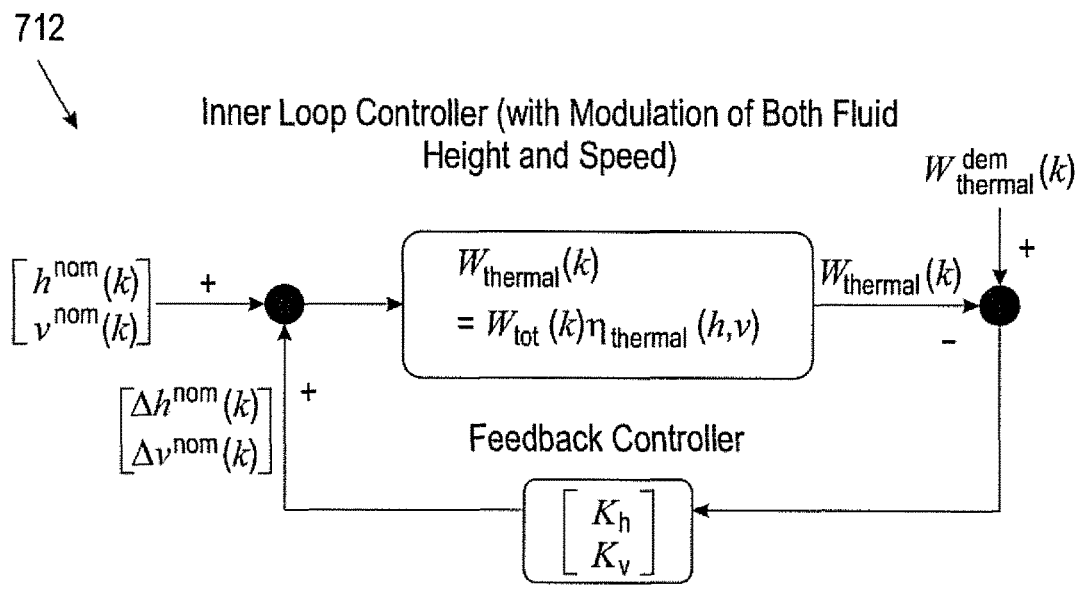

Also, FIG. 7D illustrates an inner loop control 708 with modulation of fluid height, FIG. 7E illustrates an inner loop control 710 with modulation of fluid speed/velocity, and FIG. 7F illustrates an inner loop controller 712 with modulation of both fluid height and speed. In each of FIGS. 7A-7F, a feedback controller is used to achieve a set-point/target value of either the total thermal power output or the electrical power output by adjusting the fluid height, fluid speed/velocity, or both.

Figure 8A:
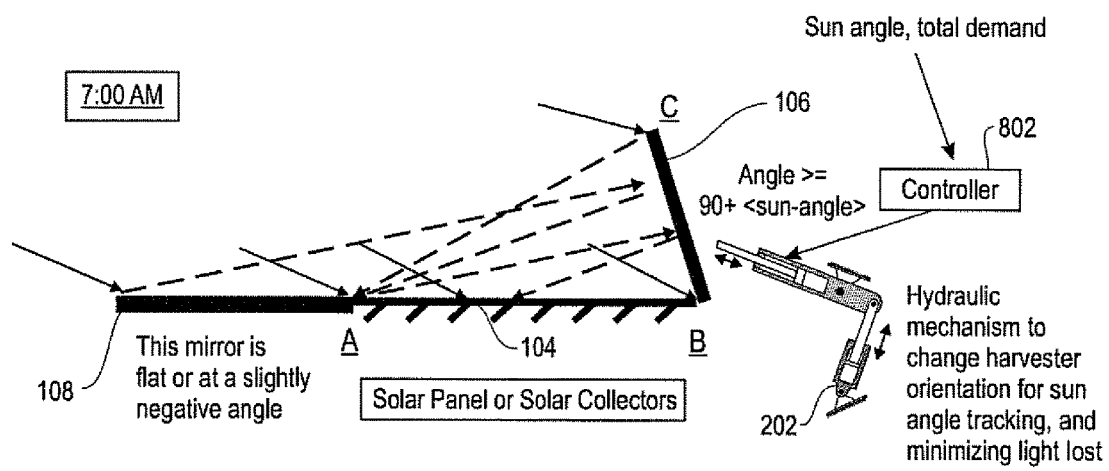
FIG. 8A-FIG. 8C are diagrams illustrating system architecture comprising flat reflectors and a hydraulic apparatus, according to exemplary embodiments of the invention.
Figure 8B:
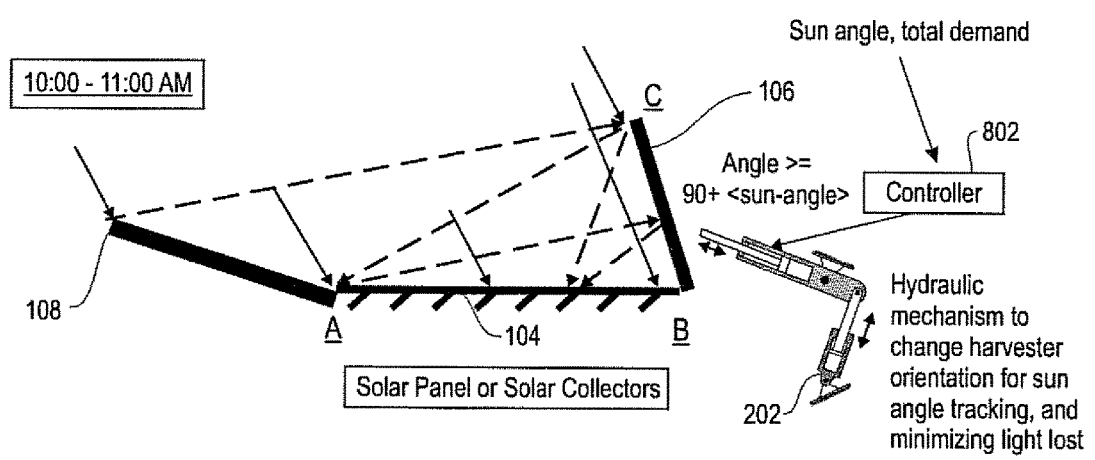
Figure 8C:
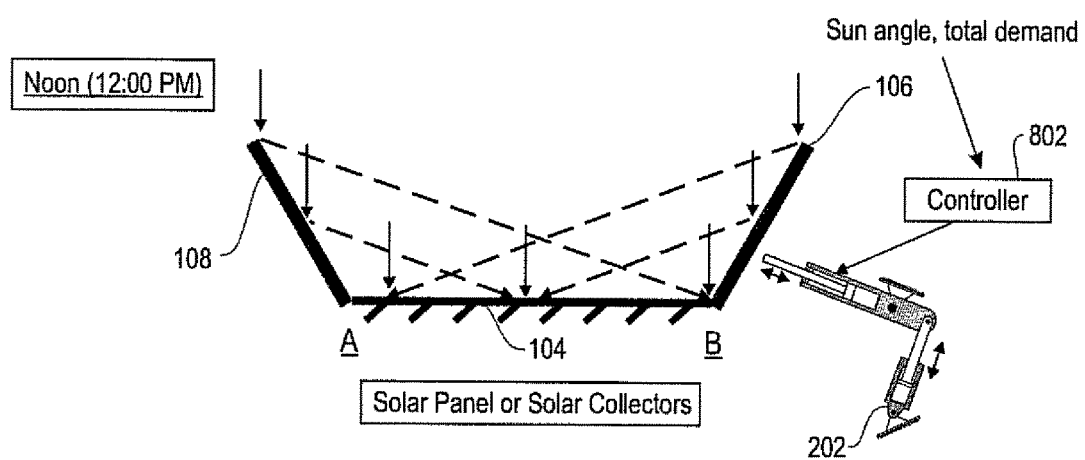

FIGS. 8A-8C are diagrams illustrating system architecture comprising flat reflectors and a hydraulic apparatus, according to exemplary embodiments of the invention. Specifically, FIG. 8A represents an example configuration for an early morning hour (such as, for example, 7:00 AM). In such a scenario, sun angle information and total demand information are provided to a controller 802, which transmits a signal to hydraulic mechanism 202 to adjust the inclination of one or more mirrors. As depicted in FIG. 8A, mirror 106 is adjusted to an angle that is ≥90 degrees plus the sun angle, and mirror 108 is adjusted to be at a flat (or slightly negative) angle. Via such a configuration, and at such a time of day, almost all direct normal irradiance (DNI) can be harvested, and the shadow on neighbors can be minimized with greater tilt (that is, all incident radiation can be captured with some PV panels, and no PV shadowing). Also, in one or more embodiments of the invention, the lengths of the reflectors/mirrors can be dynamically modified. A dynamic modification of the mirror length can be achieved, for example, via a sliding mirror arrangement, possibly with multiple mirrors stacked on top of each other.

FIG. 8B represents an example configuration for a mid-morning period (such as, for example, 10:00-11:00 AM). In such a scenario, sun angle information and total demand information are provided to the controller 802, which transmits a signal to hydraulic mechanism 202 to adjust the inclination of one or more mirrors. As depicted in FIG. 8B, mirror 106 is adjusted to an angle that is ≥90 degrees plus the sun angle, and mirror 108 is adjusted to be made expandable to capture incident light (that is, incoming solar flux as shown by solid arrows in FIG. 8B). Via such a configuration, and at such a time of day, almost all DNI can be harvested, and the shadow on neighbors can be minimized with greater tilt (that is, all incident radiation can be captured on some PV panels, and no PV shadowing).

FIG. 8C represents an example configuration for a mid-day period (such as, for example, noon (12:00 PM)). In such a scenario, sun angle information and total demand information are provided to the controller 802, which transmits a signal to hydraulic mechanism 202 to adjust the inclination of one or more mirrors. As depicted in FIG. 8C, mirror 106 can be adjusted, and mirror 108 can also be adjusted to be made expandable to capture incident light. Via such a configuration, and at such a time of day, almost all DNI incident on the reflectors can be harvested. Optionally, in one or more embodiments of the invention, any light lost between PH systems can be captured with matte finish mirrors on the floor and bi-facial panels.

Figure 9:
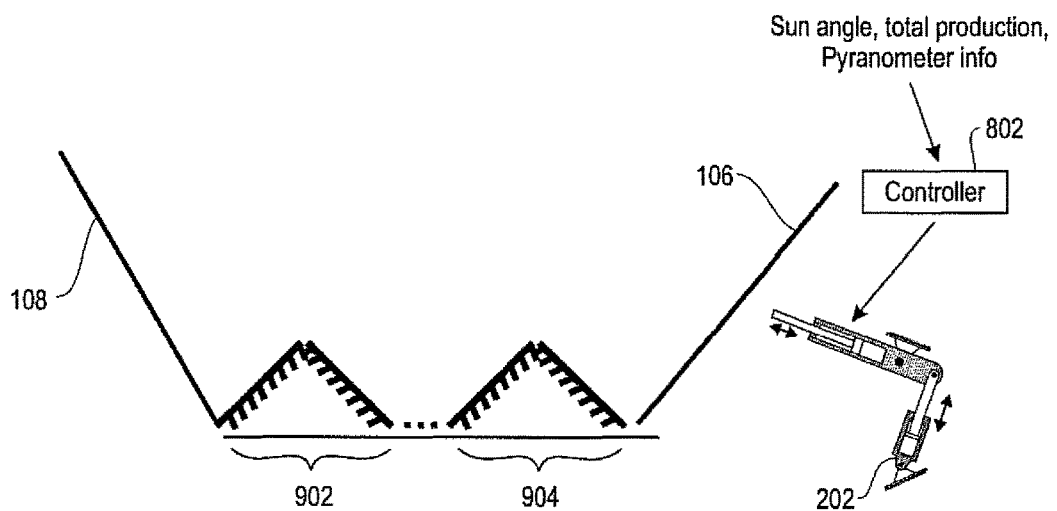
FIG. 9 is a diagram illustrating system architecture comprising inclined solar PV modules and a hydraulic apparatus, according to an exemplary embodiment of the invention.

FIG. 9 is a diagram illustrating system architecture comprising inclined solar PV modules and a hydraulic apparatus, according to an exemplary embodiment of the invention. As depicted in FIG. 9, solar panels such as 902 and 904 can be organized in inclined patterns relative to dynamically controlled photonic harvesters. Reflectors (such as 106 and 108) can serve a possibly varying set of solar PV modules depending upon time-of-day and irradiance conditions.

Figure 10:
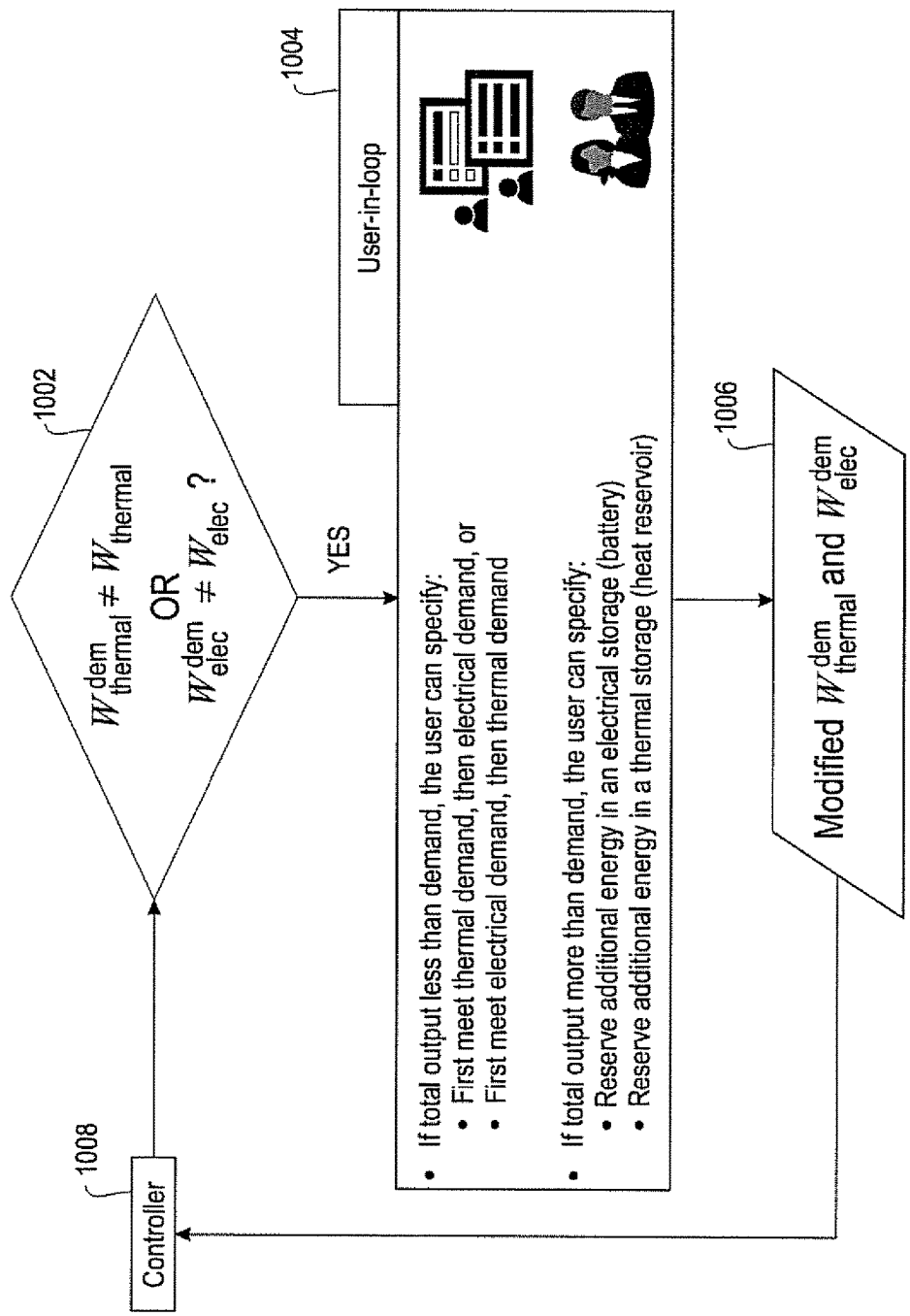
FIG. 10 is a flow diagram illustrating techniques according to an embodiment of the invention.

FIG. 10 is a flow diagram illustrating techniques according to an embodiment of the invention. As depicted in FIG. 10, information from a controller 1008 is provided to a recommendation engine to determine if matching is possible via step 1002. That is, the recommendation engine determines whether thermal power demand matches the thermal power output or whether electrical power demand matches the electrical power output. As depicted via user-in-loop 1004, the recommendation engine provides two options (for either noted mismatch). If the total output is less than the demand, the user can specify that the system should first meet the thermal demand, then meet the electrical demand, or the user can specify that the system should first meet the electrical demand, and then meet the thermal demand. If the total output is more than the demand, the user can specify that the reserve additional energy be stored in electrical storage (a battery, for example), and/or the user can specify that the reserve additional energy be stored in a thermal storage (a heat reservoir, for example). One or more embodiments of the invention can additionally include more advanced options, wherein analytics are used to generate options based on historical data and/or feasibility analyses on the control system. As further depicted in FIG. 10, information output from the user-in-loop 1004 can be provided to a modification component 1006, which can modify the thermal power demand and/or the electrical power demand, which would then be provided to the controller 1008.

Figure 11:
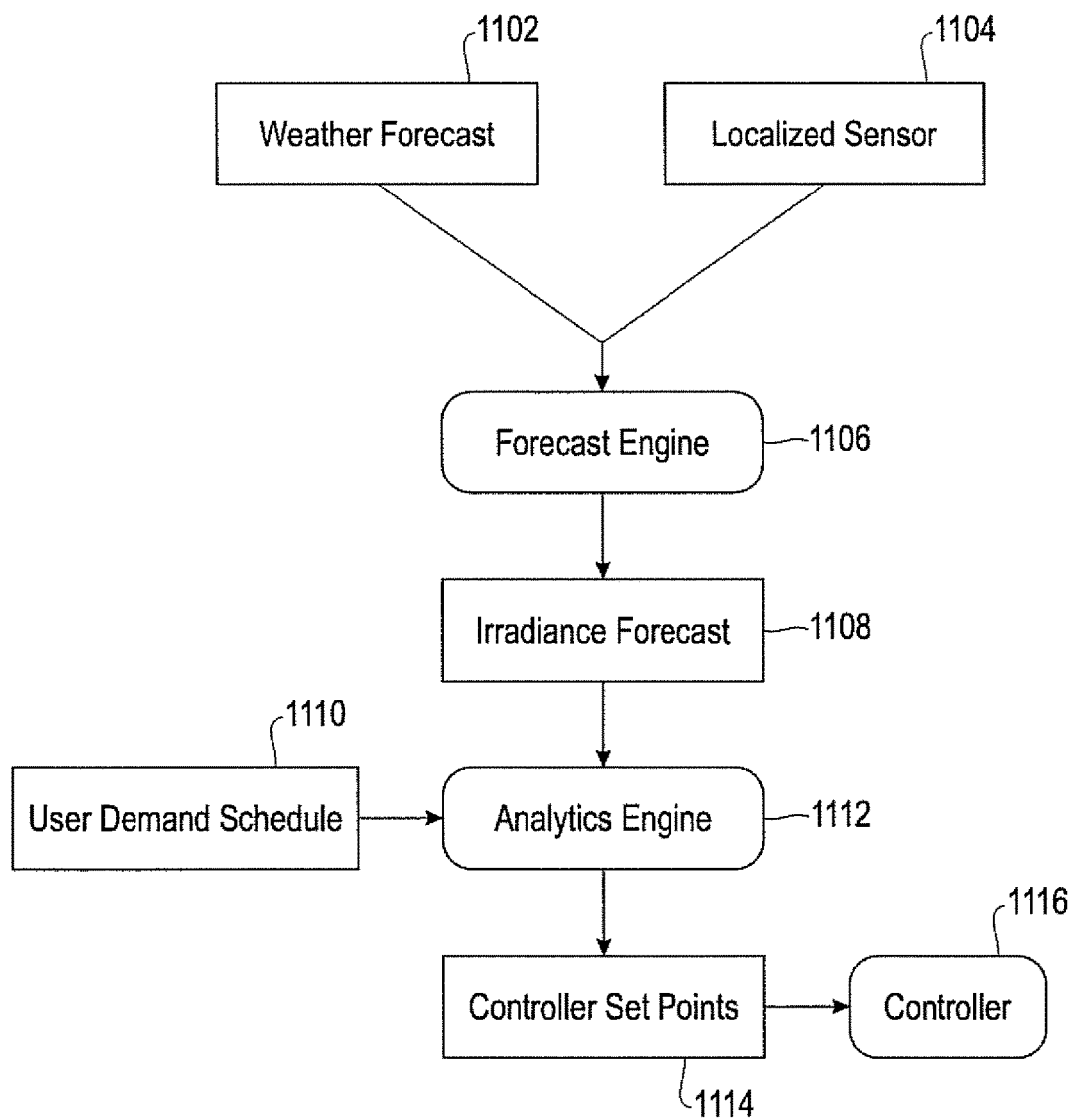
FIG. 11 is a flow diagram illustrating techniques according to an embodiment of the invention.

FIG. 11 is a flow diagram illustrating techniques according to an embodiment of the invention. By way of illustration, FIG. 11 depicts weather forecast information 1102 and localized sensor information 1104 (from a sensor such as, for example, a pyranometer or a skycam), which are provided to a forecast engine 1106. The forecast engine 1106 generates an irradiance forecast 1108 based on the provided information, and provides the forecast 1108 to an analytics engine 1112, which also receives a user demand schedule 1110. Based on the received irradiance forecast 1108 and the user demand schedule 1110, the analytics engine 1112 determines one or more controller set points 1114, and outputs these set points to the controller 1116.

Figure 12:
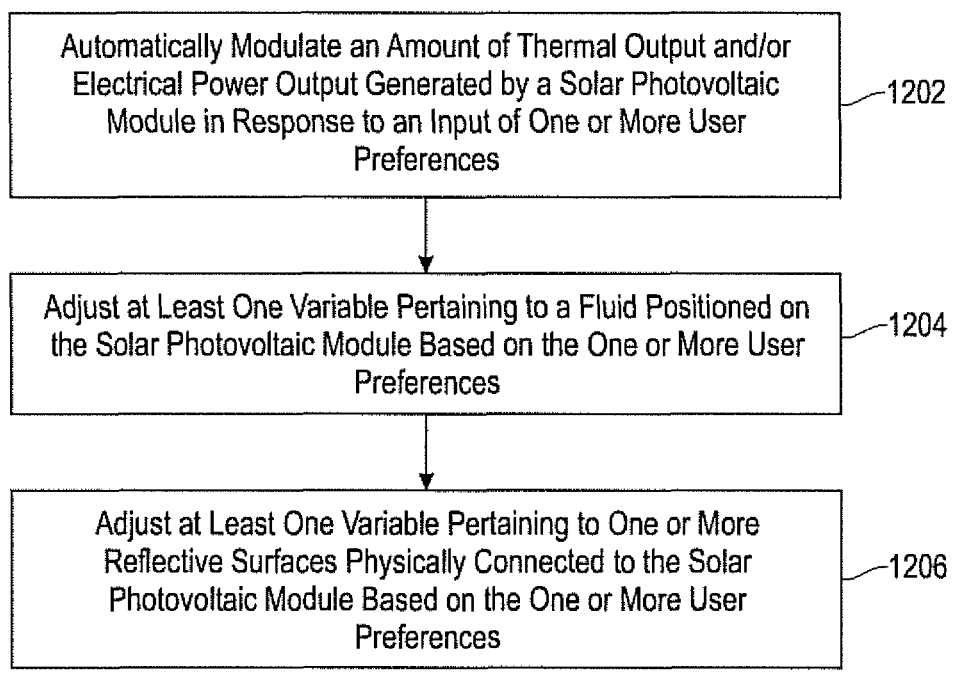
FIG. 12 is a flow diagram illustrating techniques according to an embodiment of the invention.

FIG. 12 is a flow diagram illustrating techniques according to an embodiment of the present invention. Step 1202 includes automatically modulating an amount of thermal output and/or electrical power output generated by a solar photovoltaic module in response to an input of one or more user preferences. The modulated amount of thermal output and/or electrical power output can include a predetermined percentage of thermal output and/or electrical power output generated by the solar photovoltaic module. Also, the one or more user preferences can include a total demand of thermal output and/or a total demand of electrical power output. The one or more user preferences can also include a relative proportion of (i) thermal output demand and (ii) electrical power output demand.

Additionally, automatically modulating the amount of thermal output and/or electrical power output generated by the solar photovoltaic module can include controlling an aggregate amount of thermal output and/or electrical power output generated by the solar photovoltaic module. Also, automatically modulating the amount of thermal output and/or electrical power output generated by the solar photovoltaic module can include controlling an average amount of thermal output and/or electrical power output generated by the solar photovoltaic module over a given period of time.

Step 1202 includes step 1204 and step 1206. Step 1204 includes adjusting at least one variable pertaining to a fluid positioned on the solar photovoltaic module based on the one or more user preferences. The at least one variable pertaining to the fluid can include depth (or height) of the fluid positioned on the solar photovoltaic module and/or the velocity of the fluid with respect to the solar photovoltaic module.

Step 1206 includes adjusting at least one variable pertaining to one or more reflective surfaces physically connected to the solar photovoltaic module based on the one or more user preferences. The at least one variable pertaining to the one or more reflective surfaces can include an adjustable reflectivity point of the one or more reflective surfaces and/or inclination of the one or more reflective surfaces with respect to the solar photovoltaic module.

In at least one embodiment of the invention, adjusting the at least one variable pertaining to the fluid and adjusting the at least one variable pertaining to the one or more reflective surfaces are carried out by at least one computing device.

The techniques depicted in FIG. 12 can also include processing the input of the one or more user preferences via a user interface. Additionally, the techniques depicted in FIG. 12 can include automatically recommending additional adjusting of the at least one variable pertaining to the fluid positioned on the solar photovoltaic module based on a forecast of one or more weather-related parameters, and/or automatically recommending additional adjusting of the at least one variable pertaining to the one or more reflective surfaces physically connected to the solar photovoltaic module based on a forecast of one or more weather-related parameters.

Also, an additional embodiment of the invention includes a system that can include a solar photovoltaic module, and a fluid positioned on the solar photovoltaic module, wherein at least one variable pertaining to the fluid is configurable based on one or more user preferences. In one or more embodiments of the invention, the fluid includes water. The system can also include a plurality of configurable reflective surfaces that (i) collect direct solar radiation and diffuse solar radiation and (ii) distribute the collected direct solar radiation and the collected diffuse solar radiation across (a) multiple portions of the fluid and/or (b) one or more portions of the solar photovoltaic module. Additionally, each one of the plurality of configurable reflective surfaces is physically connected to the solar photovoltaic module at an angle that is variable in relation to the surface of the solar photovoltaic module, and at least one variable pertaining to each one of the plurality of configurable reflective surfaces is configurable based on the one or more user preferences.

Further, the system can also include a controller, wherein said controller comprises at least a memory and a processor coupled to the memory. The controller modulates an amount of thermal output and/or electrical power output generated by the solar photovoltaic module in response to an input of the one or more user preferences by transmitting a signal to adjust the at least one variable pertaining to a fluid in response to the one or more user preferences, and transmitting a signal to adjust the at least one variable pertaining to one or more of the plurality of reflective surfaces in response to the one or more user preferences.

Also, in one or more embodiments of the invention, such a system can include a hydraulic mechanism coupled to the controller.

Further, at least one embodiment of the invention can include at least one glass surface positioned over the solar photovoltaic module, and a fluid positioned between (i) the glass surface and (ii) the solar photovoltaic module, wherein at least one variable pertaining to the fluid is configurable based on one or more user preferences.

The techniques depicted in FIG. 12 can also, as described herein, include providing a system, wherein the system includes distinct software modules, each of the distinct software modules being embodied on a tangible computer-readable recordable storage medium. All of the modules (or any subset thereof) can be on the same medium, or each can be on a different medium, for example. The modules can include any or all of the components shown in the figures and/or described herein. In an embodiment of the invention, the modules can run, for example, on a hardware processor. The method steps can then be carried out using the distinct software modules of the system, as described above, executing on a hardware processor. Further, a computer program product can include a tangible computer-readable recordable storage medium with code adapted to be executed to carry out at least one method step described herein, including the provision of the system with the distinct software modules.

Additionally, the techniques depicted in FIG. 12 can be implemented via a computer program product that can include computer useable program code that is stored in a computer readable storage medium in a data processing system, and wherein the computer useable program code was downloaded over a network from a remote data processing system. Also, in an embodiment of the invention, the computer program product can include computer useable program code that is stored in a computer readable storage medium in a server data processing system, and wherein the computer useable program code is downloaded over a network to a remote data processing system for use in a computer readable storage medium with the remote system.

Figure 13:
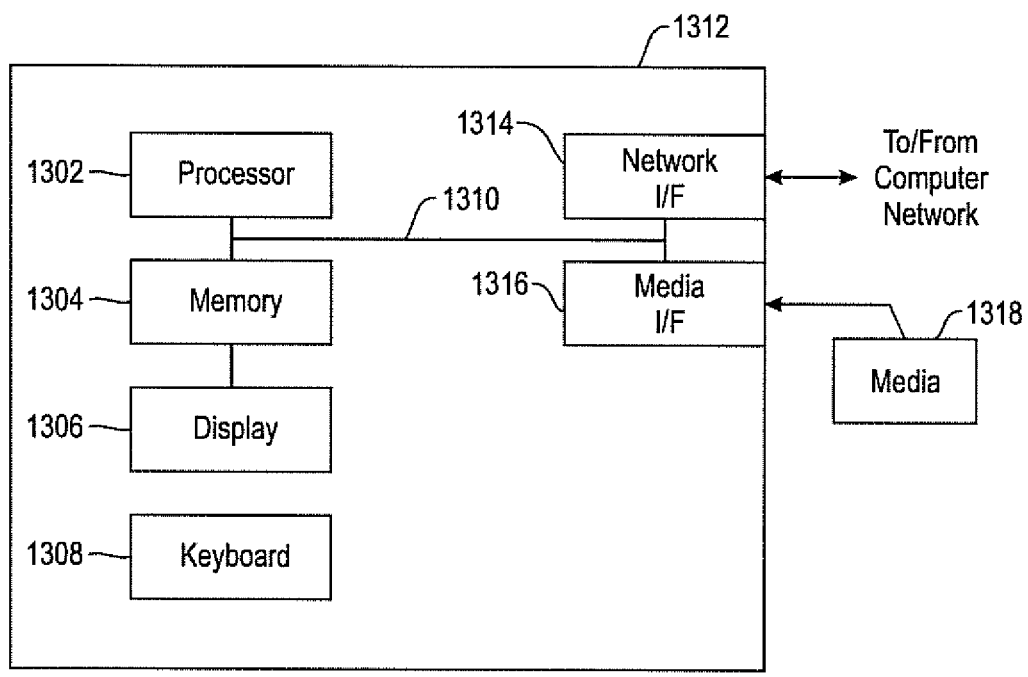
FIG. 13 is a system diagram of an exemplary computer system on which at least one embodiment of the invention can be implemented.

An embodiment of the invention or elements thereof can be implemented in the form of an apparatus including a memory and at least one processor that is coupled to the memory and configured to perform exemplary method steps. An example of such an apparatus is depicted in FIG. 13 and further described below. Additionally, such an apparatus can be encompassed and/or incorporated via one or more embodiments of the invention detailed herein. For example, in FIG. 12, such an apparatus can be incorporated in the tunable reflectivity mirrors (106 and 108) and implemented for setting the reflectivity based on a desired tradeoff between electricity and hot water, for instance. In another example, such an apparatus can be incorporated in a controller or control system (such as, for example, component 802) and implemented to adjust the flow rate of the heat extracting water based on a desired water set-point temperature. In yet another example, such an apparatus can be incorporated in a controller (such as, for example, component 802) and implemented for actuating a hydraulic actuator. In addition, in one or more embodiments of the invention, such an apparatus can be incorporated locally (as an embedded system for measurement and/or control, for instance) and/or remotely (in an operations center connected via an interface, for instance).

Additionally, an embodiment of the present invention can make use of software running on a computer or workstation. With reference to FIG. 13, such an implementation might employ, for example, a processor 1302, a memory 1304, and an input/output interface formed, for example, by a display 1306 and a keyboard 1308. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, a mechanism for inputting data to the processing unit (for example, mouse), and a mechanism for providing results associated with the processing unit (for example, printer). The processor 1302, memory 1304, and input/output interface such as display 1306 and keyboard 1308 can be interconnected, for example, via bus 1310 as part of a data processing unit 1312. Suitable interconnections, for example via bus 1310, can also be provided to a network interface 1314, such as a network card, which can be provided to interface with a computer network, and to a media interface 1316, such as a diskette or CD-ROM drive, which can be provided to interface with media 1318.

Accordingly, computer software including instructions or code for performing the methodologies of the invention, as described herein, may be stored in associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1302 coupled directly or indirectly to memory elements 1304 through a system bus 1310. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including, but not limited to, keyboards 1308, displays 1306, pointing devices, and the like) can be coupled to the system either directly (such as via bus 1310) or through intervening I/O controllers (omitted for clarity).

Network adapters such as network interface 1314 may also be coupled to the system to enable the data processing system to become coupled to other data processing systems or remote printers or storage devices through intervening private or public networks. Modems, cable modems and Ethernet cards are just a few of the currently available types of network adapters.

As used herein, including the claims, a "server" includes a physical data processing system (for example, system 1312 as shown in FIG. 13) running a server program. It will be understood that such a physical server may or may not include a display and keyboard.

The present invention may be a system, a method, and/or a computer program product at any possible technical detail level of integration. The computer program product may include a computer readable storage medium (or media) having computer readable program instructions thereon for causing a processor to carry out embodiments of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform embodiments of the present invention.

Embodiments of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that any of the methods described herein can include an additional step of providing a system comprising distinct software modules embodied on a computer readable storage medium; the modules can include, for example, any or all of the components detailed herein. The method steps can then be carried out using the distinct software modules and/or sub-modules of the system, as described above, executing on a hardware processor 1302. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof, for example, application specific integrated circuit(s) (ASICS), functional circuitry, an appropriately programmed digital computer with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of another feature, step, operation, element, component, and/or group thereof.

At least one embodiment of the present invention may provide a beneficial effect such as, for example, automatically adjusting inclination (for example, a reflective point) of one or more augmented optical mirrors and recommending an adjustment of set-points such as water level, velocity of the water passing over the panel, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:

automatically modulating an amount of thermal output and/or electrical power output generated by a solar photovoltaic module in response to an input of one or more user preferences, wherein the one or more user preferences comprise a relative proportion of (i) thermal output demand and (ii) electrical power output demand, by:

adjusting, based on the one or more user preferences, at least one variable pertaining to an un-partitioned layer of fluid, wherein the un-partitioned layer of fluid is positioned (i) on top of the solar photovoltaic module and (ii) between two or more reflective surfaces that are physically connected to the solar photovoltaic module, and wherein the at least one variable pertaining to the fluid comprises the velocity of the fluid with respect to the solar photovoltaic module, and wherein said adjusting the at least one variable pertaining to the un-partitioned layer of fluid comprises adjusting height (h) of the un-partitioned layer of fluid to satisfy at least a portion of the one or more user preferences ($\rho$) via:

$$\rho = \frac{E_{thermal}}{E_{electrical}} = \frac{A_w(h)}{A_p(h)\eta_p(h)} := f(h),$$

wherein $E_{thermal}$ refers to thermal output, $E_{electrical}$ refers to electrical power output, $A_w$ refers to absorptivity of fluid, $A_p$ refers to absorptivity of the solar photovoltaic module, and $\eta_p$ refers to electrical efficiency of the solar photovoltaic module; and adjusting at least one variable pertaining to one or more of the reflective surfaces physically connected to the solar photovoltaic module based on the one or more user preferences.

2. The method of claim 1, wherein (i) said adjusting the at least one variable pertaining to the un-partitioned layer of fluid and (ii) said adjusting the at least one variable pertaining to one or more of the reflective surfaces are carried out by at least one computing device.

3. The method of claim 1, comprising:
processing the input of the one or more user preferences via a user interface.

4. The method of claim 1, comprising:
automatically recommending additional adjusting of the at least one variable pertaining to the un-partitioned layer of fluid positioned on the solar photovoltaic module based on a forecast of one or more weather-related parameters.

5. The method of claim 1, comprising:
automatically recommending additional adjusting of the at least one variable pertaining to one or more of the reflective surfaces physically connected to the solar photovoltaic module based on a forecast of one or more weather-related parameters.

6. The method of claim 1, wherein the modulated amount of thermal output and/or electrical power output is a predetermined percentage of thermal output and/or electrical power output generated by the solar photovoltaic module.

7. The method of claim 1, wherein the fluid comprises water.

8. The method of claim 1, wherein said automatically modulating the amount of thermal output and/or electrical power output generated by the solar photovoltaic module comprises controlling an average amount of thermal output and/or electrical power output generated by the solar photovoltaic module over a given period of time.

9. The method of claim 1, wherein the one or more user preferences comprise a total demand of thermal output and/or a total demand of electrical power output.

10. The method of claim 1, wherein the at least one variable pertaining to the fluid comprises the depth of the fluid positioned on the solar photovoltaic module.

11. The method of claim 1, wherein the at least one variable pertaining to one or more of the reflective surfaces comprises an adjustable reflectivity point of the one or more reflective surfaces.

12. The method of claim 1, wherein the at least one variable pertaining to one or more of the reflective surfaces comprises inclination of the one or more reflective surfaces with respect to the solar photovoltaic module.

* * * * *